(12) United States Patent
Mohamadi

(10) Patent No.: US 8,446,072 B2
(45) Date of Patent: May 21, 2013

(54) HIGH-EFFICIENCY COMPACT MINIATURIZED ENERGY HARVESTING AND STORAGE DEVICE

(75) Inventor: Farrokh Mohamadi, Irvine, CA (US)

(73) Assignee: Farrokh Mohamadi, Newport Beach, CA (US)

( * ) Notice: Subject to any disclaimer, the term of this patent is extended or adjusted under 35 U.S.C. 154(b) by 0 days.

(21) Appl. No.: 13/476,732

(22) Filed: May 21, 2012

(65) Prior Publication Data
US 2012/0228995 A1    Sep. 13, 2012

Related U.S. Application Data

(62) Division of application No. 12/631,772, filed on Dec. 4, 2009, now Pat. No. 8,283,840.

(60) Provisional application No. 61/187,235, filed on Jun. 15, 2009.

(51) Int. Cl.
*H01L 41/08* (2006.01)
*H02N 2/18* (2006.01)

(52) U.S. Cl.
USPC ........................................ 310/339

(58) Field of Classification Search
USPC ........................ 310/317–319, 339
See application file for complete search history.

(56) References Cited

U.S. PATENT DOCUMENTS

| 7,990,024 B2* | 8/2011 | Chou ............................. 310/339 |
| 8,003,982 B2* | 8/2011 | Wang et al. ..................... 257/43 |
| 2010/0117488 A1* | 5/2010 | Wang et al. ................... 310/339 |
| 2011/0084345 A1* | 4/2011 | Park et al. ...................... 257/415 |

OTHER PUBLICATIONS

B. Pokroy et al., Fabrication of Bioinspired Actuated Nanostructures with Arbitrary Geometry and Stiffness. Advanced Material, 2009, pp. 463-469, vol. 21.
B.S. Lee et al., Power Harvesting Using Piezoelectric MEMS Generator with Interdigital Electrodes, IEEE Ultrasonics Symposium, 2007, pp. 1598-1601.
R. Whinnery et al., Fields and Waves in Communication Electronics, John Wiley & Sons, Inc. 1965. pp. 186-188.

* cited by examiner

*Primary Examiner* — J. San Martin
(74) *Attorney, Agent, or Firm* — Haynes and Boone, LLP

(57) ABSTRACT

An energy harvesting and storage system includes an array of piezoelectric electrodes, in which the piezoelectric electrodes generate electrical energy from mechanical displacements of the piezoelectric electrodes; and an array of capacitor electrodes disposed in proximity to the piezoelectric electrodes, in which the array of capacitor electrodes stores a portion of the energy generated by the piezoelectric electrodes. An energy system includes a substrate including an array of micro-post electrodes connected to a cathode layer of the substrate; an isolation material covering the array of micro-post electrodes; and an anode layer including electrodes filling the remaining region between the isolation material-covered micro-post electrodes, in which the anode layer, electrodes, isolation material, micro-post electrodes, and substrate are monolithically coupled.

7 Claims, 11 Drawing Sheets

HIGH-EFFICIENCY COMPACT MINIATURIZED ENERGY HARVESTING AND STORAGE DEVICE

CROSS REFERENCE TO RELATED APPLICATIONS

This application is a divisional continuation application of co-pending U.S. patent application Ser. No. 12/631,772, filed Dec. 4, 2009, of which it claims the benefit of priority and which claims the benefit of U.S. Provisional Application No. 61/187,235, filed Jun. 15, 2009, both of which are incorporated by reference.

BACKGROUND

The present disclosure generally relates to electrical power supplies and, more particularly, to miniaturized energy harvesting and storage.

Conventional electro-chemical batteries are often used in powering sensor electronics, for example, in components for wireless communication. Their finite power capacity thus may become a major limitation in deploying sensor electronics with conventional batteries in the field for prolonged unattended operations. Therefore, there has been an increasing demand for harvesting electrical energy from ambient vibrations in the surrounding environment using electromechanical transducers based on electromagnetic, electrostatic, or piezoelectric effects. Among these transducers, piezoelectric power generators are the most applicable to miniaturized sensors because of their great potential in achieving high power densities using novel nano-scale materials and structures. The current technology is limited to a handful of nano-structures made of piezoelectric materials such as ZnO (zinc oxide) with potential output power densities of about 80 milliwatts per square meter ($mW/m^2$). Requirements for future systems may dictate higher power densities beyond these values for powering miniaturized (e.g., having a volume less than one cubic millimeter) sensors.

SUMMARY

According to one embodiment, an energy harvesting system includes an array of piezoelectric electrodes, in which the piezoelectric electrodes generate electrical energy from mechanical displacements of the piezoelectric electrodes; and an array of capacitor electrodes interspersed with the piezoelectric electrodes, in which the array of capacitor electrodes stores a portion of the energy generated by the piezoelectric electrodes.

According to another embodiment, an energy system includes a substrate including an array of micro-post electrodes connected to a cathode layer of the substrate; an isolation material covering the array of micro-post electrodes; and an anode layer including electrodes filling the remaining region between the isolation material-covered micro-post electrodes, in which the anode layer, electrodes, isolation material, micro-post electrodes, and substrate are monolithically coupled.

According to still another embodiment, a method includes piezoelectrically converting mechanical strain energy from an induced mechanical stress on an array of piezoelectric electrode posts into electrical energy; and using a geometrical arrangement of an array of capacitor electrode posts and the array of piezoelectric electrode posts to capacitively store the electrical energy in the array of capacitor electrode posts.

According to yet another embodiment, a method of manufacturing an energy generation and storage device includes: forming an array of silicon posts on a substrate; making an elastomeric mold of the array of silicon posts having wells corresponding to the posts; casting an array of piezoelectric electrode posts from the mold; orienting the array of piezoelectric electrode posts so as to be interdigitally aligned with the array of silicon posts; and disposing the array of piezoelectric electrode posts and the array of silicon posts so as to be interdigitally arranged with each other.

According to another embodiment, a method of manufacturing an energy generation and storage device includes: etching an array of posts in a silicon substrate using reactive ion etching process; implanting and annealing the silicon substrate to form a cathode layer; forming one of either a piezoelectric or a dielectric layer on the array of posts; and depositing a layer of doped polysilicon on the array of posts to form an anode layer.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments and their advantages are best understood by referring to the detailed description that follows. Like reference numerals are used to identify like elements illustrated in one or more of the figures.

DETAILED DESCRIPTION

In accordance with one or more embodiments of the present invention, systems and methods disclosed herein provide a technical feasibility to take advantage of advances in nanofabrication technologies to develop complementary units of electrical generator and storage chips built in a compatible Si manufacturing process. Advanced flexible and curable materials may be used to produce highly efficient mechanical-to-electrical power coupling through the optimization of physical and geometrical configurations to yield power densities with two orders of magnitude higher energy than prior art technologies. In one embodiment a system may include miniaturized (e.g., volume less than 1 mm$^3$) sensors equipped with electronics components for wireless data transmission. Furthermore, the components in accordance with one or more embodiments may be used in scenarios in the field. For example, such components may be mounted on unmanned aerial vehicles (UAV) or unmanned ground vehicles (UGV) in extreme environments.

Embodiments provide a highly integrated and sensitive pressure sensor and storage unit that can convert impacts or motion (acceleration) to electrical signals and after rectification deliver the electrical energy to a large capacitor acting as a battery for the source of energy. A fully integrated system with the highest energy generation and storage may be achieved using an ionizable material in a cathode layer of the capacitor. The battery-less power supply unit has an excellent application for powering wireless devices that can be used for tracking or remote monitoring of traffic heavy communications environments. The integral energy harvesting—storing unit can be easily serially chained such that more energy can be harvested. Due to the simple nature of manufacturing the array posts, multiple energy conversion units such as optical-electrical (photo voltaic), kinetics-electrical (MEM based devices), and radiation-electrical (plasma) transducers can be chained in parallel from ground to space applications.

Figure 1:
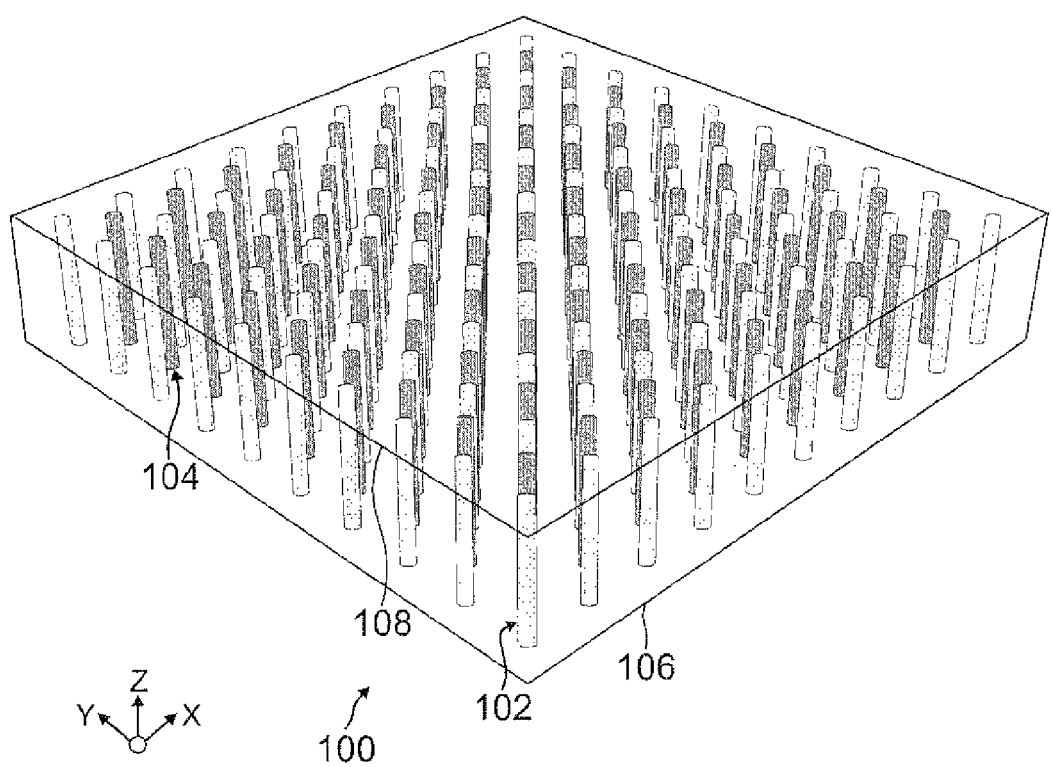
FIG. 1 is a perspective diagram illustrating an energy harvesting and storage system in accordance with one embodiment.
Figure 2:
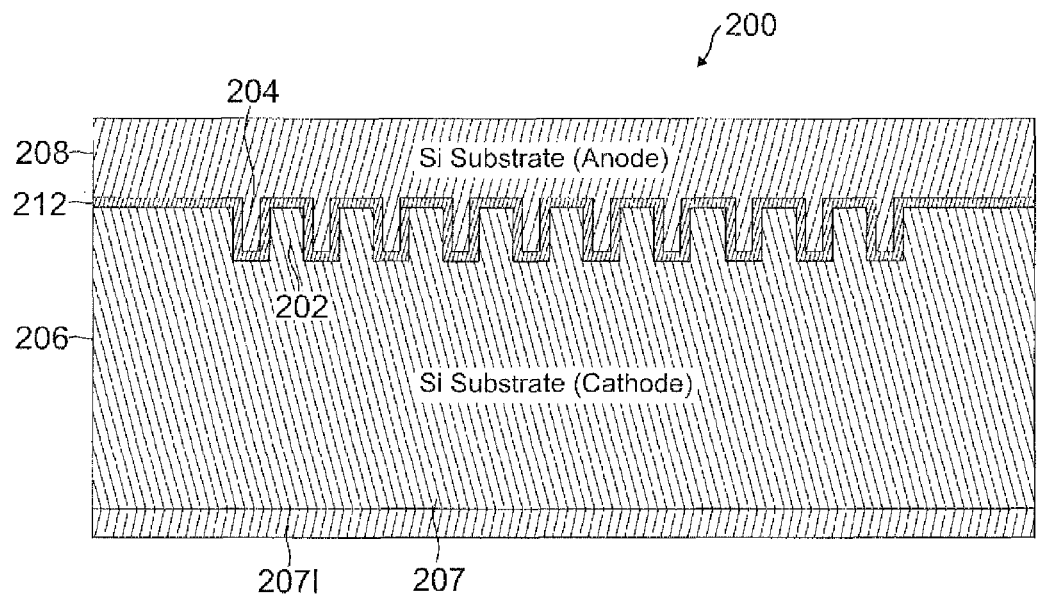
FIG. 2 is a cross sectional diagram illustrating an energy harvesting and storage system in accordance with another embodiment.

FIG. 1 illustrates an energy harvesting and storage system 100 according to one or more embodiments. System 100 may include an array of piezoelectric high aspect ratio electrode posts 102 (lighter gray in FIG. 1) and an array of capacitive high aspect ratio electrode posts 104 (darker gray in FIG. 1). Array of piezoelectric high aspect ratio electrode posts 102 may be fainted from or attached to a substrate 106. Array of capacitive high aspect ratio electrode posts 104 may be formed from or attached to a substrate 108. The substrates 106, 108 and arrays 102, 104 may be arranged interspersed with each other as shown in FIGS. 1 and 2. The arrays 102, 104 may be arranged interdigitally with each other, e.g., posts 102 (light gray) in-between and alternating with posts 104 (dark gray), which are also in-between and alternating with posts 102, as shown in FIG. 1. System 100 (and system 200 shown in FIG. 2) may employ a two-step integration of using a piezoelectric array (e.g., array of electrodes 102) to generate the desired energy and a second array of silicon micro-posts (e.g., array of electrodes 104) as a highly capacitive load to store the generated energy.

FIG. 2 illustrates an example of an energy harvesting and storage system 200 according is to another embodiment. System 200 may include an array of high aspect ratio electrode posts 202. Isolation material 212 may be a piezoelectric material—such as lead zirconate titanate (PZT)—for an energy generator, e.g., array of piezoelectric electrodes 202; or isolation material 212 may be a high dielectric material—such as tantalum oxide ($Ta_7O_5$)—for an energy storage device, e.g., array of capacitive electrodes 202. Accordingly, the choice of isolation material 212 enables the arrangement of the arrays of posts 202 to act either as energy generation or energy storage systems.

System 200 may include a cathode layer 207 electrically connecting the array of electrodes 202. For example, the substrate 206 may include silicon implanted by a high dose of arsenic and annealed to form a continuous cathode layer 207. In an alternative embodiment, cathode layer 207 may include a metallic layer or lower plate 2071, for example, of gold or aluminum, that forms a cathode. In another embodiment, cathode layer 207 may include an ionizable material. Such a material may be formed, for example, using an acidic liquid similar to the process of constructing car batteries, to form an ionizable aqueous cathode layer 207. Also, for example, cathode layer 207 may include a polarizable polymer. Higher energy generation and storage may be achieved using such an ionizable material for substrate 206 or cathode layer 207 in a fully integrated system 200.

System 200 may include an anode layer 208 electrically connecting the electrodes 204. Electrodes 204 may be an array of posts 204 interspersed or interdigitally arranged with posts 202, for example, or may be electrode material either connecting to or integral with anode layer 208 and filling the region between posts 202 (e.g., the region remaining after posts 202 are covered by isolation material 212). In the example of electrodes 204 filling the space between posts 202, the interdigital post separation (or gap between posts defined below with reference to FIG. 7 and equation (3)) is effectively reduced to zero. Thus, the anode layer 208, including electrodes 204 may be monolithically coupled to an ionizable aqueous layer 206. Anode layer 208 may exert pressure (e.g., by transmitting vibrations from the ambient environment of system 200) on piezoelectric material 212 (e.g., PZT) as part of the energy generating function of system 200.

Figure 3:
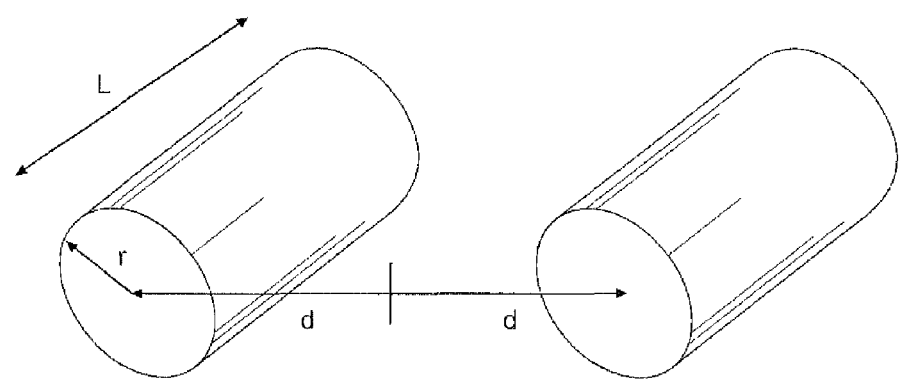
FIG. 3 is a geometrical diagram illustrating a pair of posts in accordance with an embodiment.

FIG. 3 illustrates geometrical parameters for a pair of posts, such as electrode posts 102, 104, 202, or 204. The parameters may affect the electrical and mechanical properties of the arrays of electrode posts 102, 104, 202, and 204. As seen in FIG. 3, L represents the length or height of the posts; r represents the radius of the posts; and 2d represents the distance of separation between pairs of posts of an array; this separation distance 2d may also be referred to as the "pitch". L/2r may be defined as the aspect ratio of the electrode posts; the aspect ratio of the posts may be defined as being "high" to the extent that L>2r.

Figure 4:
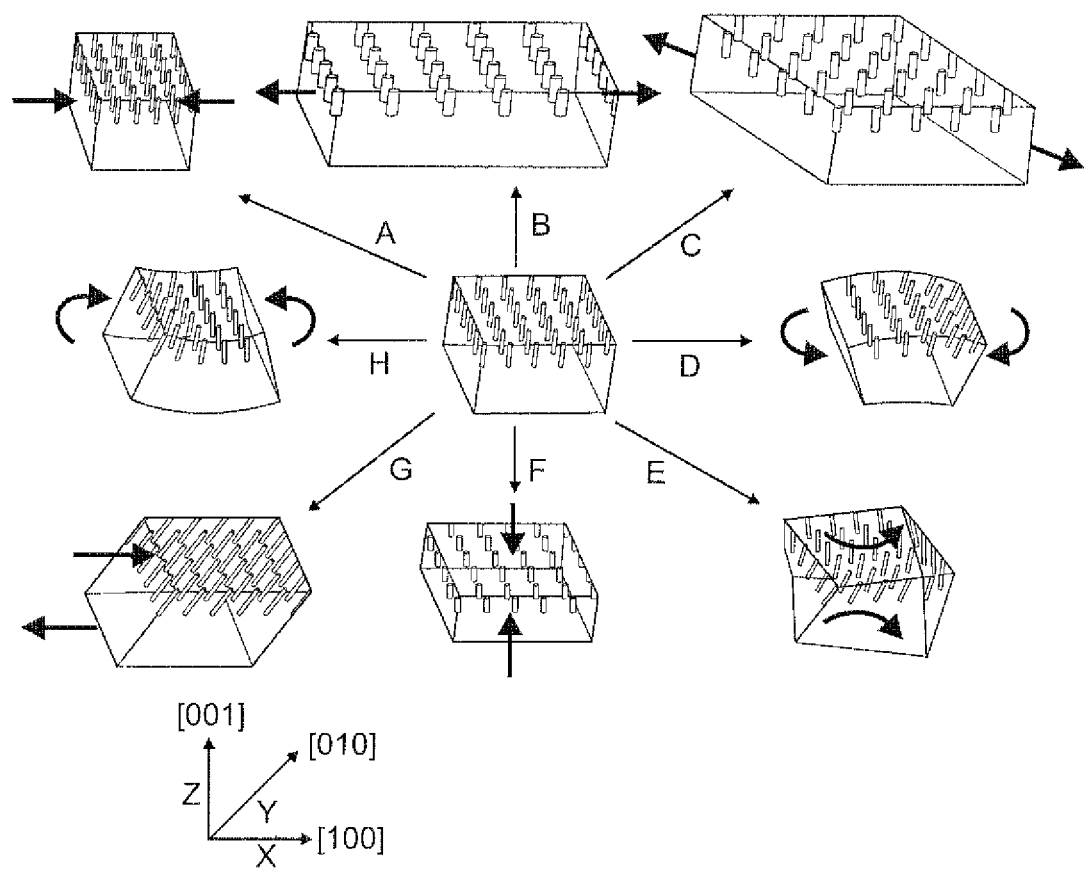
FIG. 4 is a set of schematic three-dimensional renderings of various deformations of an array of posts in accordance with one or more embodiments.

FIG. 4 illustrates various deformations of an array of posts, e.g., arrays of electrode posts 102, 104, 202, or 204, that may be useful for micro-fabricated substrates in an elastomeric polymer, polydimethylsiloxane (PDMS). PDMS may be built by using an array of silicon (Si) electrode posts to provide a replica of the array and be used to act as the mold to build the motion sensitive power generating sensor (e.g., comprising array of piezoelectric posts 102). The unmodified mold (center) can, for example, be: A) compressed along the [100] direction, B) stretched along the [100] direction, C) stretched along the [110] direction; D) uniformly concavely curved, E) torsioned around the [001] axis, F) compressed along the [001] direction, G) sheared along the [100] direction, or H)

uniformly curved convexly. For example, the mold may be subjected to one or more of the deformations A through H, shown in FIG. 4, while the array of posts (e.g., array of piezoelectric posts 102) is being fabricated using the deformed mold to arrive at an array of posts exhibiting the chosen deformation.

Figure 5:
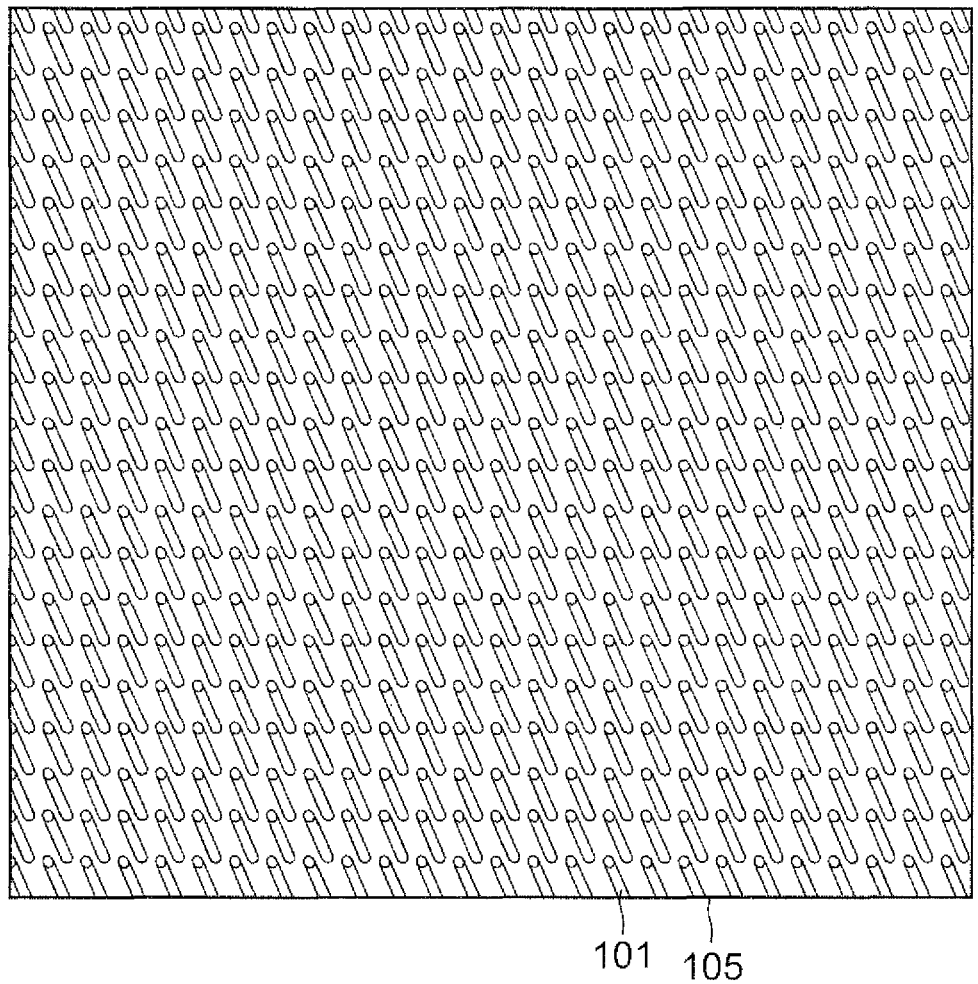
FIG. 5 is a scanning electron microscope (SEM) image of a nanostructured surface of a material, such as an array of posts in accordance with one or more embodiments, with an inset showing an energy dispersive spectroscopy (EDS) spectrum of the material.

FIG. 5 illustrates an initial array of high aspect ratio posts 101 formed from a silicon substrate 105 (from which, e.g., arrays of posts 102 or 104 may be replicated on substrates 106, 108, respectively, or which may be used directly for, e.g., array of capacitive posts 104). The initial substrate 105 with high-aspect-ratio posts 101 can be formed, for example, using standard lithographical techniques, grown bottom-up (e.g., nano-wires), or using a biological sample. In one embodiment, arrays of Si micro-posts (micro-electrodes) may be formed with a pitch 2d (distance between the posts), a post radius of r, and a length L (see FIG. 3). The array of posts 101 may serve multiple purposes. The array may be used to create a mold that piezoelectric material can be poured in, cured, and used to generate electricity upon exertion of force or motion on the system. Additionally, the array of Si posts may be used to be placed in parallel and adjacent to a flipped array with significant storage capability, e.g., for capacitive storage of electrical energy. This combination of power generation and storage provides an ideal power capability for a vast spectrum of remotely connected wireless networks of sensor clusters.

Mechanical stability of the structures expected to be formed using micro-posts with high aspect ratio (e.g., arrays of posts 101, 102, 104, 202, 204) should be considered. There are several factors that can lead to the collapse of micro-posts: collapse due to weight, due to adhesion forces between the posts and the base surface, and due to lateral adhesion between the posts. Calculations show that the first two factors may be considered to be insignificant to affect the arrays 101, 102, 104, 202, 204; even though the importance of the second factor increases with the fabrication of tilted nanostructures (see, e.g., FIG. 4G). The lateral adhesion force is the strongest of the three, and should be taken into account. The critical aspect ratio, below which there will be no lateral collapse, is given by:

$$L/2r = (0.57E^{1/3}(2d)^{1/2})/(\gamma_s^{1/3}(2r)^{1/6}(1-v^2)^{1/12}) \quad \text{Eq. (1)}$$

where L is the height of the post, r is the radius of the post, d is the half pitch (separation distance=2d) between posts, $\gamma_s$ is the surface energy, v is the Poisson ratio of the post material, and E is an extendability factor of the post material. L, r, and d may be measured in centimeters (cm), Poisson ration may be about 0.5 for PMDS, and extendability factor (300%) may be measured in Giga Pascals (GPa).

The mechanics of the movement of the electrode posts (e.g., arrays of posts 101, 102, 104, 202, 204) is a key issue when designing functional micro-posts. When a force is applied on the post—considered as a beam—parallel to the initial direction of the unbent post, there is a critical force below which no bending (buckling) occurs. When a force F acts along the entire post length L, perpendicular to the posts, the deflection $Y_{Lz}$, at a given point $L_z$ from the base, is given by:

$$Y_{Lz} = F(L_z)^3/8EI \quad \text{Eq. (2)}$$

where E is the bending modulus and I is the moment of inertia. For a post with a circular cross-section of radius r, the moment of inertia is given by the relation $I=\pi r^4/4$.

To obtain an estimate for the forces needed to actuate the micro-post using E=1 GPa, L=8 microns, and r=1.25 microns, to deflect the tip of the post by 0.5 microns, one would need a force of about 1.5 nano-Newtons (nN). If the same force F is applied only to the tip of the post, the tip will deflect 2.67 times as far, indicating the ultra sensitivity for use of the array as a pressure sensor that can be used for electrical signal generation.

Figure 6:
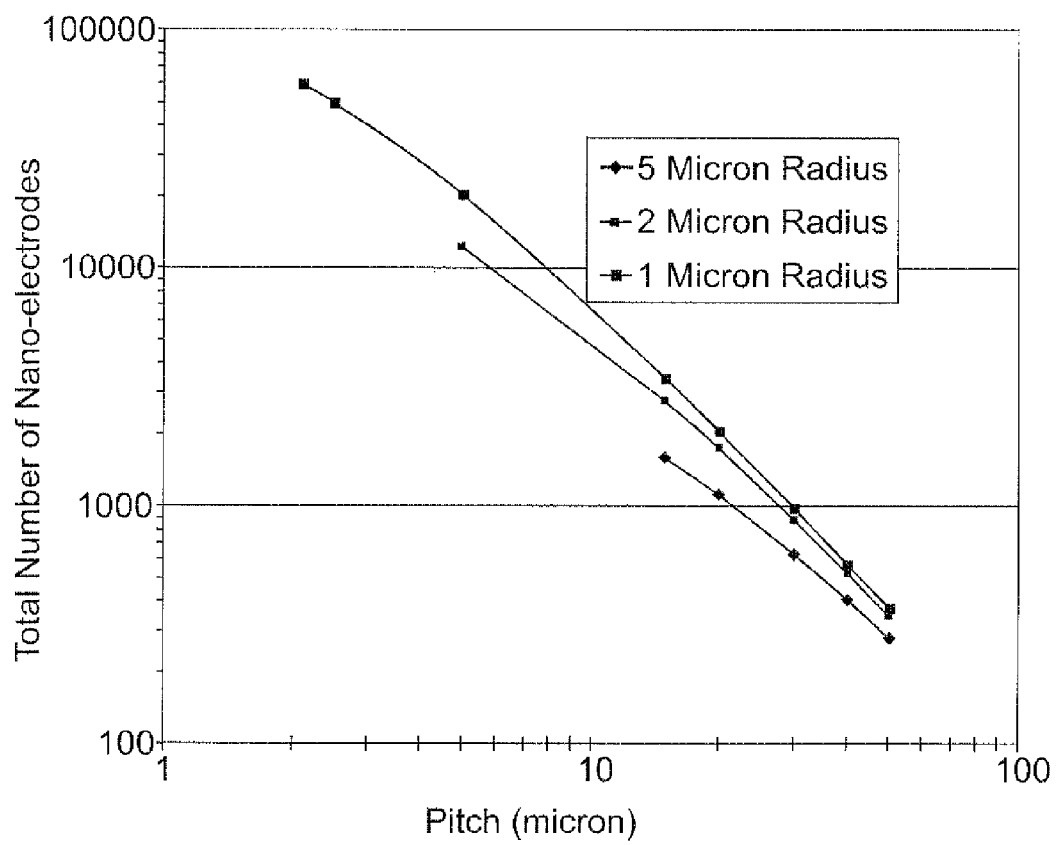
FIG. 6 is a graph showing examples of total number of electrodes in a one square millimeter area as a function of pitch (distance between electrodes) for three different sizes of electrodes in accordance with one or more embodiments.

FIG. 6 graphically illustrates the total number of electrodes in a one square millimeter area as a function of pitch (distance between electrodes) for three different sizes of electrodes in accordance with one or more embodiments. By decreasing the diameter of the micro-electrodes and the separation distance (pitch) between the electrodes, as well as increasing the length (and, thus, aspect ratio) of the micro-electrodes, high density of electrodes can be compacted in a 1 mm$^2$ substrate. Examples of integration capability for the number of Si posts is shown in FIG. 6.

Figure 7:
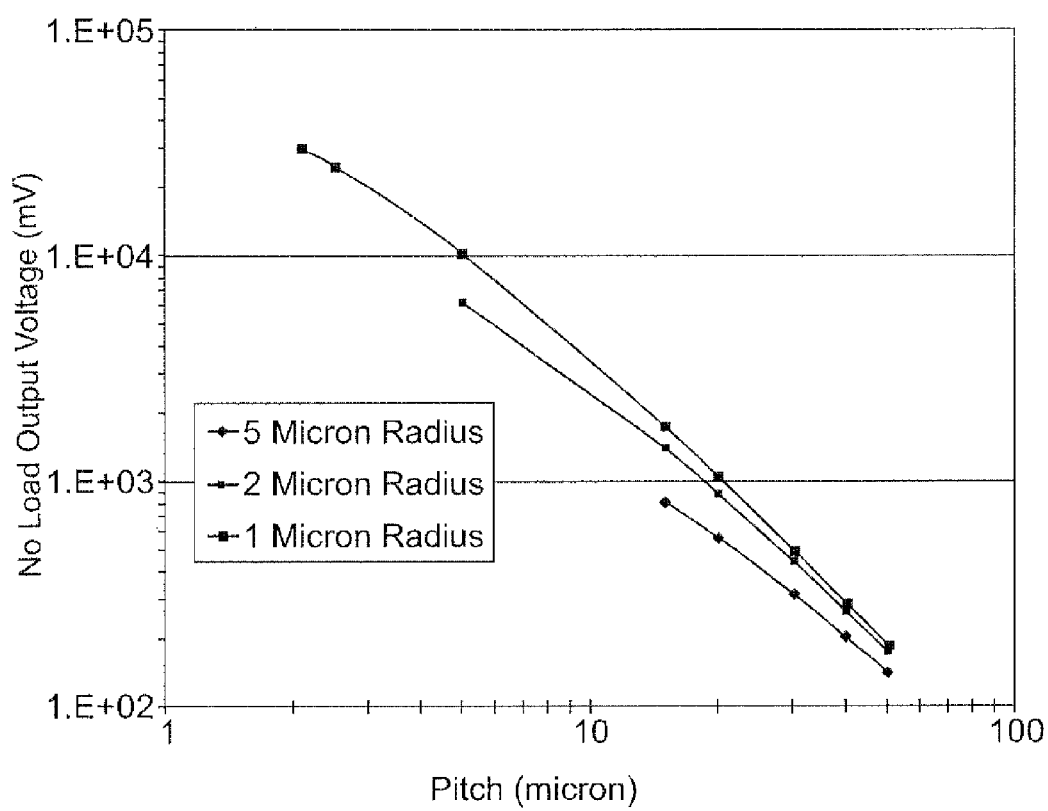
FIG. 7 is a graph showing examples of output voltage for electrodes as a function of pitch (distance between electrodes) for three different sizes of electrodes in accordance with one or more embodiments.

FIG. 7 graphically illustrates examples, in accordance with one or more embodiments, of output voltage for arrays of electrodes as a function of pitch (distance between electrodes) for three different sizes of electrodes. For an array of posts, voltage induced by an application of a force (stress) can be modeled using an equation as:

$$V = \sigma_x g_x/(2d-2r) \quad \text{Eq. (3)}$$

where V is the generated voltage, $\sigma_x$ is stress in the x-direction, $g_x$ is the piezoelectric coefficient, and d and r are, respectively, the half pitch and the post radius as described above so that (2d−2r) is the gap between posts.

When the array (e.g., array of posts 101, 102, 104, 202, or 204) is subjected to ambient vibrations, mechanical stress is induced inside the piezoelectric layers due to sufficient inertial force provided by the proof mass, which, for example, may be attached to or integral with the substrate 106 or 108. At these moments, the piezoelectric layer—e.g., layer 212 shown in FIG. 2—converts the mechanical strain energy into electrical energy and the generated charges are extracted through the posts (electrodes)—e.g. electrodes 202, 204 shown in FIG. 2. Since the output voltage is a function of the output charge and the capacitance between the posts (electrodes), the output voltage can be adjusted by changing the distance (2d) between the electrodes. As the array has the maximum strain at the fixed end, it is clear that the electrode pair close to the fixed end will generate more charges than the other electrode pairs. The generated charges decrease with respect to the distance to the fixed end of the electrode pairs and the generated open circuit voltage is the average of that generated by each electrode pair as shown in FIG. 7.

Figure 8:
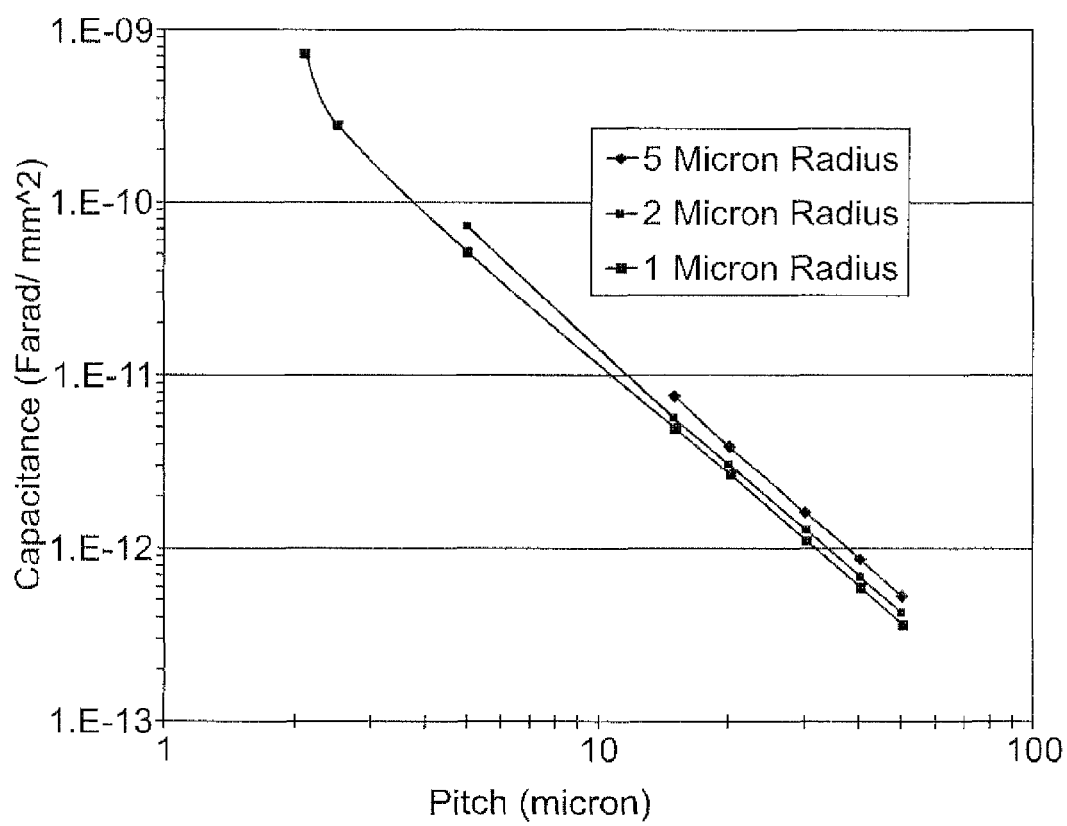
FIG. 8 is a graph showing examples of total capacitance for a one square millimeter array of electrodes as a function of pitch (distance between electrodes) for three different sizes of electrodes in accordance with one or more embodiments.

FIG. 8 graphically illustrates examples, in accordance with one or more embodiments, of total capacitance for a one square millimeter array of electrodes as a function of pitch (distance between electrodes) for three different sizes of electrodes. The effective capacitance of array of electrodes having post height L, post radius r, and pitch 2d can be calculated using Equations 4 and 5 as follows:

$$Q = V_0/2Ln(d/r + (d^2/r^2-1)^{1/2}) = V_0/2 \cos h^{-1}(d/r) \quad \text{Eq. (4)}$$

where Q is the total charge (in Coulumbs); $V_0$ is voltage between the posts, r is the radius of the posts, and d is the half pitch (i.e., 2d is the separation distance) between posts.

Given the field ($V_0$) at the two cylindrical micro-electrode posts (see FIG. 7), one can compute the effective capacitance as:

$$C = \pi \in /\cos h^{-1}(d/r) \quad \text{Eq. (5)}$$

where C is the total effective capacitance (in Farads), $\pi=3.14159$, and $\in$ is the surrounding material's permittivity; $\in = \in_r \in_0$ where $\in_r$=relative permittivity and $\in_0$=air permittivity, e.g., about $8.86 \times 10^{-14}$ Farad/cm.

As seen in FIG. 6, on the order of magnitude of 100,000 micro-electrodes can be placed in a 1 mm$^2$ area using a 1 micron radius and greater than 2 micron separation. Hence, the effective capacitance can approach order of magnitude near nano-Farad/mm$^2$ (substantial increase over prior art) as shown in FIG. 8.

Figure 9A:
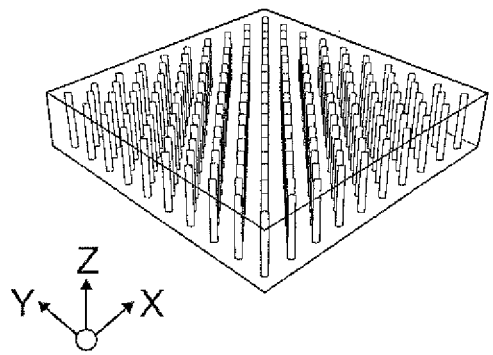
FIGS. 9A, 9B, and 9C are perspective illustrations depicting three examples of electrode arrays, in accordance with one or more embodiments, for which radius-to-separation ratios vary, affecting capacitance values of the three electrode arrays.
Figure 9B:
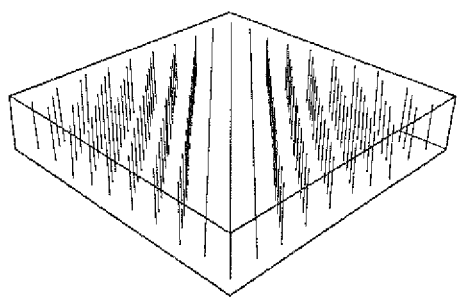
Figure 9C:
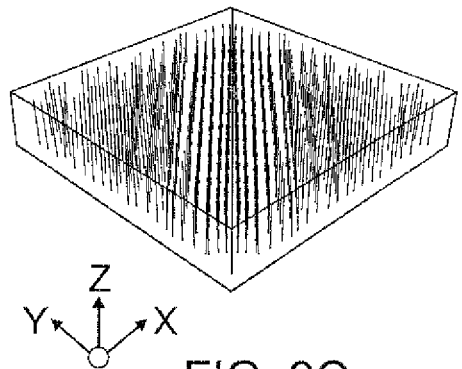
Figure 10A:
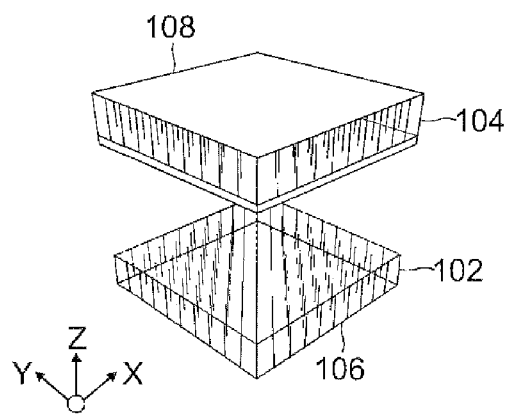
FIGS. 10A, 10B, 10C, 10D are perspective illustrations corresponding to steps in a manufacturing process for an energy harvesting and storage system in accordance with an embodiment.
Figure 10B:
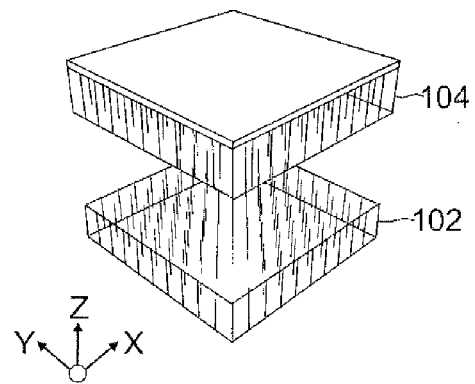
Figure 10C:
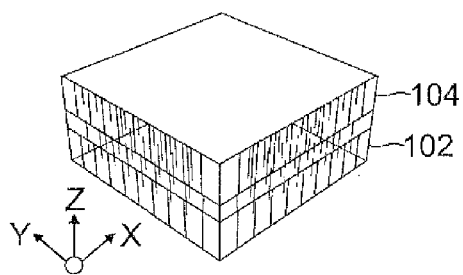
Figure 10D:
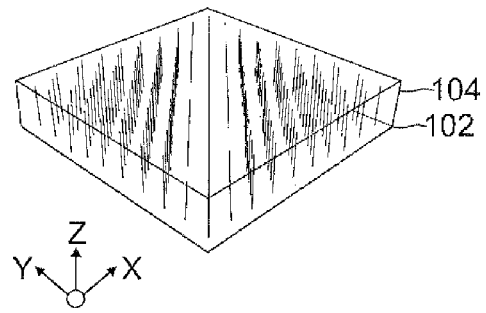

FIGS. 9A, 9B, and 9C depict examples of arrays of microelectrodes that have been used for estimation of effective capacitance (e.g., using the simulation software). The radius-to-separation ratios (e.g., r/d) vary among the examples shown, affecting capacitance values of the three electrode arrays. FIG. 9A shows an array with radius-to-separation ratio of 5/10; FIG. 9B shows an array with radius-to-separation ratio of 1/10; and FIG. 9C shows an array with radius-to-separation ratio of 1/2.1. While value of the capacitance per 1 mm$^2$ increases by two orders of magnitude (see FIG. 8), FIG. 9 also is an indication of the complexity of the manufacturing process to achieve near 1 nano-Farad per mm$^2$, which is described with reference to FIGS. 10 and 11.

FIGS. 10A, 10B, 10C, 10D illustrate steps in a manufacturing process for an energy harvesting and storage system in accordance with one or more embodiments. At FIG. 10A, an Si substrate 108 is used to provide an array of posts 104. The array 104 is used to create a negative replica (not shown) of the Si posts and then used to create a replica 102, 106 of the Si array with the piezoelectric material. An important requirement is that the negative replica must be able to peel off or detach easily without disrupting the fine structure of the Si so that the features are accurately replicated across a large scale. The PDMS or paraffin mold created has an array of wells, into which the desired material (e.g., piezoelectric material such as PZT) is cast in liquid form and cured. The mold is then either peeled off or heated and dissolved (paraffin) to reveal the replicated structure 102, 106. These surfaces should exhibit superhydrophobic, self-cleaning properties, and the water droplets remain suspended on the tips of the array and roll off the surface, similar to the properties reported for the original Si master array 104, 108. At FIG. 10B, the original array 104 is "flipped" with respect to the replicated (e.g., piezoelectric array) 102; in other words, the two arrays 102, 104 are oriented so that the posts of the two arrays 102, 104 can be interdigitally interspersed with each other. At FIG. 10C, the two arrays 102, 104 are aligned so that the posts of the two arrays 102, 104 can be interdigitally interspersed with each other, e.g., without collisions between posts of opposing arrays. At FIG. 10D, the two aligned arrays 102, 104 may be brought together and fused or bonded, for example, to form an energy harvesting and storage system 100 as seen in FIG. 1.

FIGS. 11A, 11B, 11C, 11D illustrate steps in an alternative manufacturing process for an energy harvesting and storage system in accordance with one or more embodiments. The process of FIG. 11 may be simpler with less need for alignment accuracy as well as bonding (fusing) compared to the process of FIG. 10.

Figure 11A:
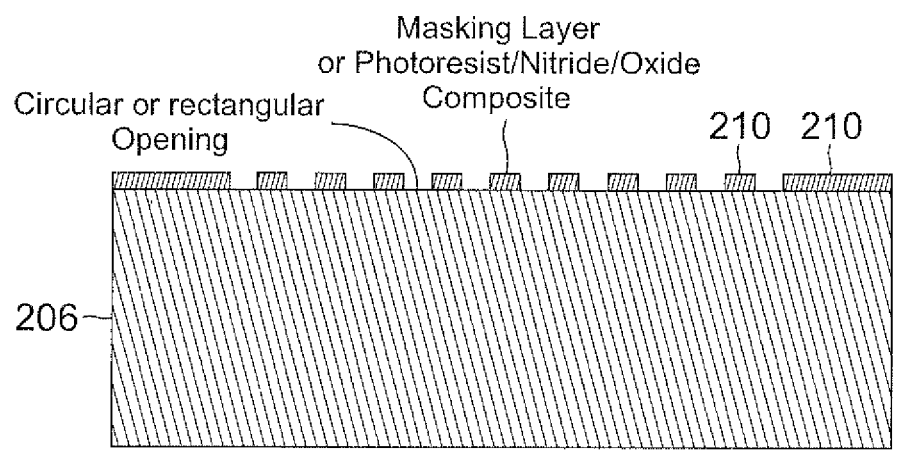
FIGS. 11A, 11B, 11C, 11D are perspective illustrations corresponding to steps in a manufacturing process for an energy harvesting and storage system in accordance with another embodiment.

At FIG. 11A, Si substrate 206 may be oxidized and then coated with a thin layer of nitride 210 to provide a shield against reactive ion etching (RIE) of the substrate 206 to create the array of posts 202.

Figure 11B:
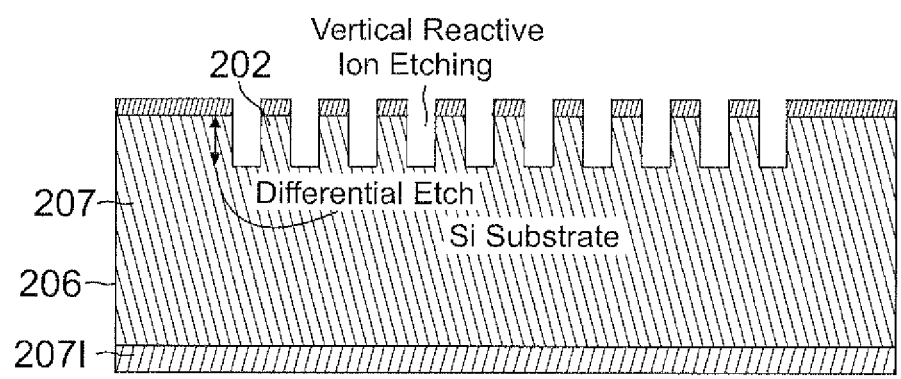

At FIG. 11B, after processing the array of Si posts 202, the Si substrate 206 may be implanted by a high dose of arsenic and annealed to form a continuous cathode layer 207. In an alternative embodiment, a cathode 2071 may be formed (e.g., from metal such as gold or aluminum) as a lower plate of substrate 206. Alternatively, layer 206 and posts 202 may be formed as an ionizable aqueous layer or may be formed from a polarizable polymer.

Figure 11C:
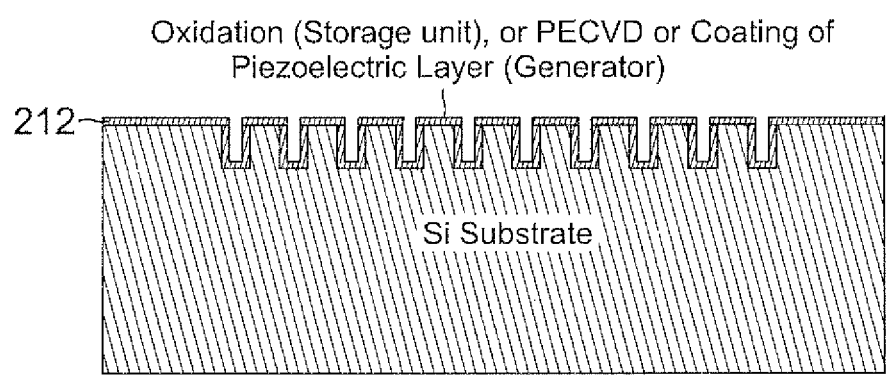

For an energy storage unit, the substrate 206 may then be subjected to thermal oxidation to grow the isolation (200 to 500 angstroms) to be followed by the low pressure chemical vapor deposition (LPCVD) of an isolation layer 212 of nitride ($\in_r=7$) or a high dielectric material such as Ta$_2$O$_5$ ($\in_r=17$). For an energy generating unit, as well as a more efficient storage unit, a Si process compatible PZT ($\in_r>200$) as shown in FIG. 11C may be used. Plasma enhanced chemical vapor deposition (PECVD) process may also be used. Another oxidation or dielectric isolation cycle may be performed to ensure the integrity of the isolation layer 212 (transducer oxide in case of generator, or high dielectric insulator for the storage capacitor)

Figure 11D:
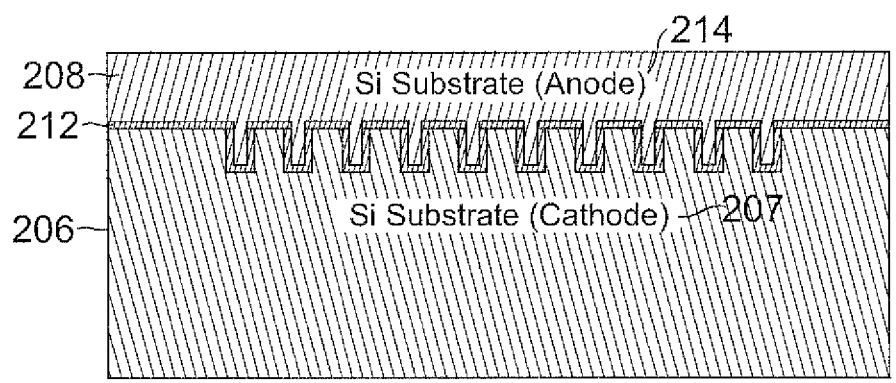

As shown at FIG. 11D, after proper surface cleaning, a layer of doped poly silicon 208 may be deposited to form the electrodes 204 filling in the remaining space around and between the isolation material-covered posts 202 and forming an anode layer 214. A thin layer of is metallization (e.g., aluminum or gold, not shown) may then be sputtered on anode layer 214 to enhance the ohmic contacts for the storage capacitor. The same substrate 206 can be pre-processed to have the switching devices for regulation of power from the generator to the large storage capacitor.

Embodiments described herein illustrate but do not limit the disclosure. It should also be understood that numerous modifications and variations are possible in accordance with the principles of the present disclosure. Accordingly, the scope of the disclosure is best defined only by the following claims.

I claim:

1. A method comprising:
piezoelectrically converting mechanical strain energy from an induced mechanical stress on an array of piezoelectric electrode posts into electrical energy; and
using a geometrical arrangement of an array of capacitor electrode posts and the array of piezoelectric electrode posts to capacitively store the electrical energy in the array of capacitor electrode posts.

2. The method of claim 1, further comprising:
inducing mechanical stress from vibrations of a proof mass integral with a substrate on which are formed at least one of the piezoelectric electrode posts or the capacitor electrode posts on the array of piezoelectric electrode posts.

3. The method of claim 1,
wherein:
the array of capacitor electrode posts is geometrically arranged with the array of piezoelectric electrode posts interdigitally.

4. The method of claim 1, wherein:
the array of capacitor electrode posts is geometrically arranged with the array of piezoelectric electrode posts by nesting.

5. The method of claim 1, wherein:
a voltage of the stored electrical energy is adjusted in accordance with a determination of a pitch between the electrodes.

6. The method of claim 1, wherein:
an aspect ratio of the piezoelectric electrode posts is determined in accordance with avoiding collapse of the posts due to adhesion forces between the posts.

7. The method of claim 1, wherein:
the arrays of electrode posts are formed with an area density of at least 400 per square millimeter.

* * * * *